(12) United States Patent
Lee et al.

(10) Patent No.: US 8,270,142 B2
(45) Date of Patent: Sep. 18, 2012

(54) DE-CLAMPING WAFERS FROM AN ELECTROSTATIC CHUCK

(75) Inventors: William D. Lee, Newburyport, MA (US); Ashwin M. Purohit, Gloucester, MA (US); Marvin R. LaFontaine, Kingston, NH (US); Richard J. Rzeszut, Billerica, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 767 days.

(21) Appl. No.: 12/331,619

(22) Filed: Dec. 10, 2008

(65) Prior Publication Data

US 2010/0142113 A1 Jun. 10, 2010

(51) Int. Cl.
*H01L 21/683* (2006.01)
(52) U.S. Cl. ....................................................... 361/235
(58) Field of Classification Search ................... 361/234
See application file for complete search history.

(56) References Cited

U.S. PATENT DOCUMENTS

| | | | |
|---|---|---|---|
| 5,904,779 A * | 5/1999 | Dhindsa et al. | 118/723 E |
| 6,305,677 B1 * | 10/2001 | Lenz | 269/13 |
| 6,947,274 B2 | 9/2005 | Kellerman et al. | |
| 7,072,166 B2 | 7/2006 | Qin et al. | |
| 7,073,383 B2 * | 7/2006 | Jones et al. | 73/627 |
| 7,751,172 B2 * | 7/2010 | Purohit et al. | 361/234 |
| 7,821,767 B2 * | 10/2010 | Fujii | 361/234 |
| 8,040,655 B2 * | 10/2011 | Weijiang et al. | 361/234 |
| 2006/0238953 A1 * | 10/2006 | Hanawa et al. | 361/234 |

\* cited by examiner

*Primary Examiner* — Stephen W Jackson
*Assistant Examiner* — Angela Brooks
(74) *Attorney, Agent, or Firm* — Eschweiler & Associates, LLC

(57) ABSTRACT

One embodiment of the present invention relates to a method for declamping a semiconductor wafer that is electrically adhered to a surface of an electrostatic chuck by a clamping voltage. In this method, the clamping voltage is deactivated. For a time following the deactivation, a first region of the wafer is lifted an first distance from the surface of the electrostatic chuck while a second region of the wafer remains adhered to the surface of the electrostatic chuck. A predetermined condition is monitored during the time. The second region is lifted from the surface of the electrostatic chuck when the predetermined condition is met.

18 Claims, 4 Drawing Sheets

DE-CLAMPING WAFERS FROM AN ELECTROSTATIC CHUCK

FIELD OF DISCLOSURE

The present invention relates generally to semiconductor processing systems, and more specifically to methods and systems for declamping a wafer from an electrostatic chuck.

BACKGROUND

For quite some time, electrostatic chucks have been utilized in plasma-based or vacuum-based semiconductor processes such as etching, CVD, and ion implantation, etc. A typical electrostatic chuck, for example, comprises a dielectric layer positioned over a conductive electrode, wherein a semiconductor wafer is placed on a surface of the electrostatic chuck. During semiconductor processing, a clamping voltage is typically applied between the wafer and the electrode, resulting in electrostatic forces that adhere the wafer to the surface of the electrostatic chuck.

In many applications, however, declamping or un-sticking the wafer from the chuck surface is a concern. For example, after the clamping voltage is turned off, the wafer typically "sticks" to the chuck surface for a considerable amount of time, wherein the wafer cannot be adequately removed by typical wafer lifting mechanisms. In one previous solution, using a typical wafer lifting mechanism where the wafer is lifted from the surface in one fell swoop can result in the wafer "popping" from the surface of the chuck. This "pop" can occur with such force the wafer is not only freed from the chuck, but also becomes dislodged from the wafer lifting mechanism. This can ultimately result in the wafer tumbling to the ground, which can break the wafer or riddle the wafer with defects to such an extent to render it is unsalvageable.

Therefore, a need exists in the art for declamping systems and methods which are capable of adequately removing a wafer from an electrostatic chuck.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

One embodiment of the present invention relates to a method for declamping a semiconductor wafer that is electrically adhered to a surface of an electrostatic chuck by a clamping voltage. In this method, the clamping voltage is deactivated. For a time following the deactivation, a first region of the wafer is lifted a first distance from the surface of the electrostatic chuck while a second region of the wafer remains adhered to the surface of the electrostatic chuck. A predetermined condition is monitored during the time. The second region is lifted from the surface of the electrostatic chuck when the predetermined condition is met.

The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
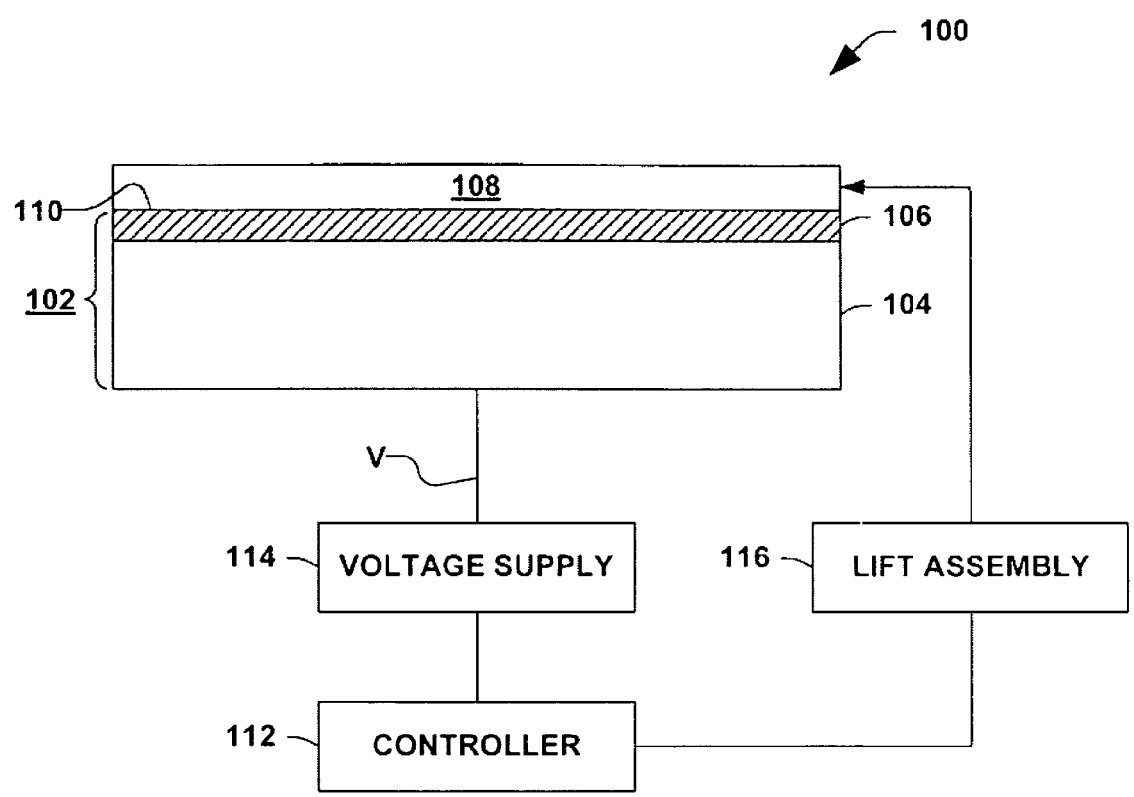
FIG. 1 is a system-level block diagram of an electrostatic clamping system according to one aspect of the present invention.

The present invention is directed towards a system and a method for declamping a wafer utilizing an electrostatic chuck. This chuck may be either a Coulombic type chuck or a Johnsen-Rabbeck, (J-R) type chuck, among others. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

The present invention overcomes challenges of the prior art by providing systems and methods for de-clamping a wafer (e.g., a semiconductor substrate), wherein only a portion of the wafer is lifted from a surface of the electrostatic chuck until a predetermined condition is met. When the predetermined condition is met, the wafer is completely removed from the surface of the chuck. In this manner, the wafer is gradually removed from the chuck with limited "popping" force, thereby reducing the number of dropped wafers and still maintaining favorable throughput for the system.

Referring now to the drawings, FIG. 1 illustrates a block diagram of a clamping system 100 in accordance with some aspects of the invention. The clamping system includes an electrostatic chuck 102 comprised of a conductive base 104 and a thin dielectric 106. During operation, a wafer 108 is selectively adhered to a surface 110 of the dielectric 106 by a clamping voltage V applied to the conductive base 104. This clamping voltage V results in an electrostatic force that adheres the wafer 108 to the dielectric surface 110.

To facilitate this functionality, a controller 112 provides control signals to a voltage supply 114, which selectively applies the clamping voltage V to the electrostatic chuck 102. The controller 112 is also operable to control a lift assembly 116 that lifts the wafer 108 through various distances to remove it from the dielectric surface 110. At a first time in removing the wafer 108, the controller 112 instructs the lift assembly 116 to only slightly lift the wafer 108 from the dielectric surface 110. While the wafer is slightly lifted from the dielectric surface 110, the controller 112 monitors a predetermined condition. When the predetermined condition is met, the controller 112 instructs the lift assembly 116 to completely remove the wafer 108 from the dielectric surface 110.

In one embodiment, the lift assembly 116 may comprise a mechanical lift assembly, such as a series of pins that movably extend from the dielectric surface 110 or an arm that grasps the wafer 108 and moves it from the dielectric surface 110. In other embodiments, the lift assembly 116 may comprise an electrostatic lift assembly that provides an electrostatic force to lift the wafer 108, a magnetic lift assembly that provides a magnetic force to lift the wafer 108, or a pressurized gas supply adapted to lift the wafer 108, among others.

Now that an illustrative clamping system 100 has been described, more detailed functionality is described with reference to the FIG. 2's flowchart, which shows one methodology 200 in accordance with the invention. In many embodiments, the clamping system 100 includes suitable combinations of software, hardware and firmware to carry out this methodology 200 as well as other functionality described herein. While methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Figure 2:
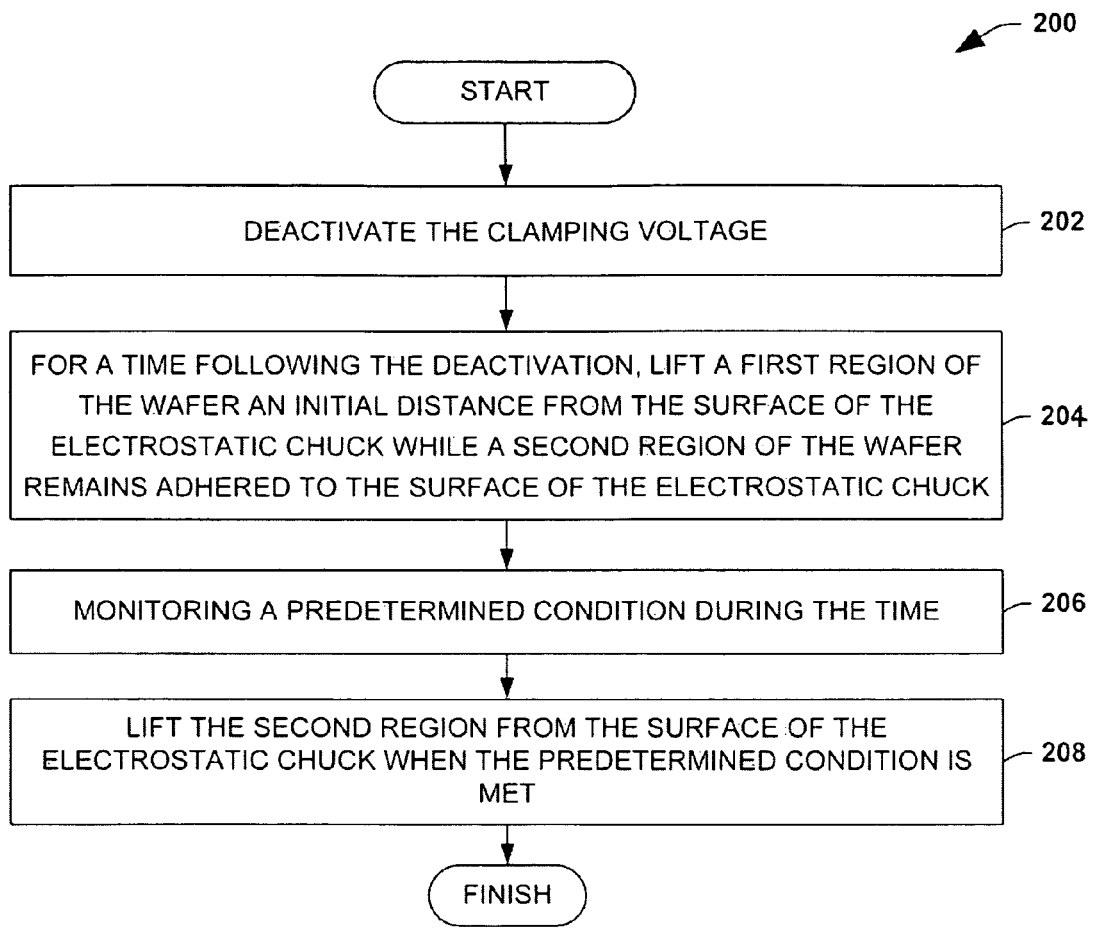
FIG. 2 illustrates a method for clamping and declamping a wafer according to another aspect of the present invention.

In FIG. 2, prior to act 202, a clamping voltage is activated to adhere the wafer to the chuck and processing operations are carried out on the wafer. Beginning with act 202, the clamping voltage is deactivated. In act 204, for a time following the deactivation, a first region of the wafer is lifted from the surface of the electrostatic chuck while a second region of the wafer remains adhered to the surface of the electrostatic chuck. In act 206, a predetermined condition is measured during the time. This predetermined condition can relate to a capacitance measured between the chuck and the wafer or to an expiration time as measured from the deactivation of the clamping voltage, among others. In act 208, the second region is lifted from the surface of the electrostatic chuck when the predetermined condition is met. For example, if the measured capacitance is greater than a threshold value or if the time is greater than the expiration time, the wafer is completely removed from the surface of the electrostatic chuck.

Figure 3:
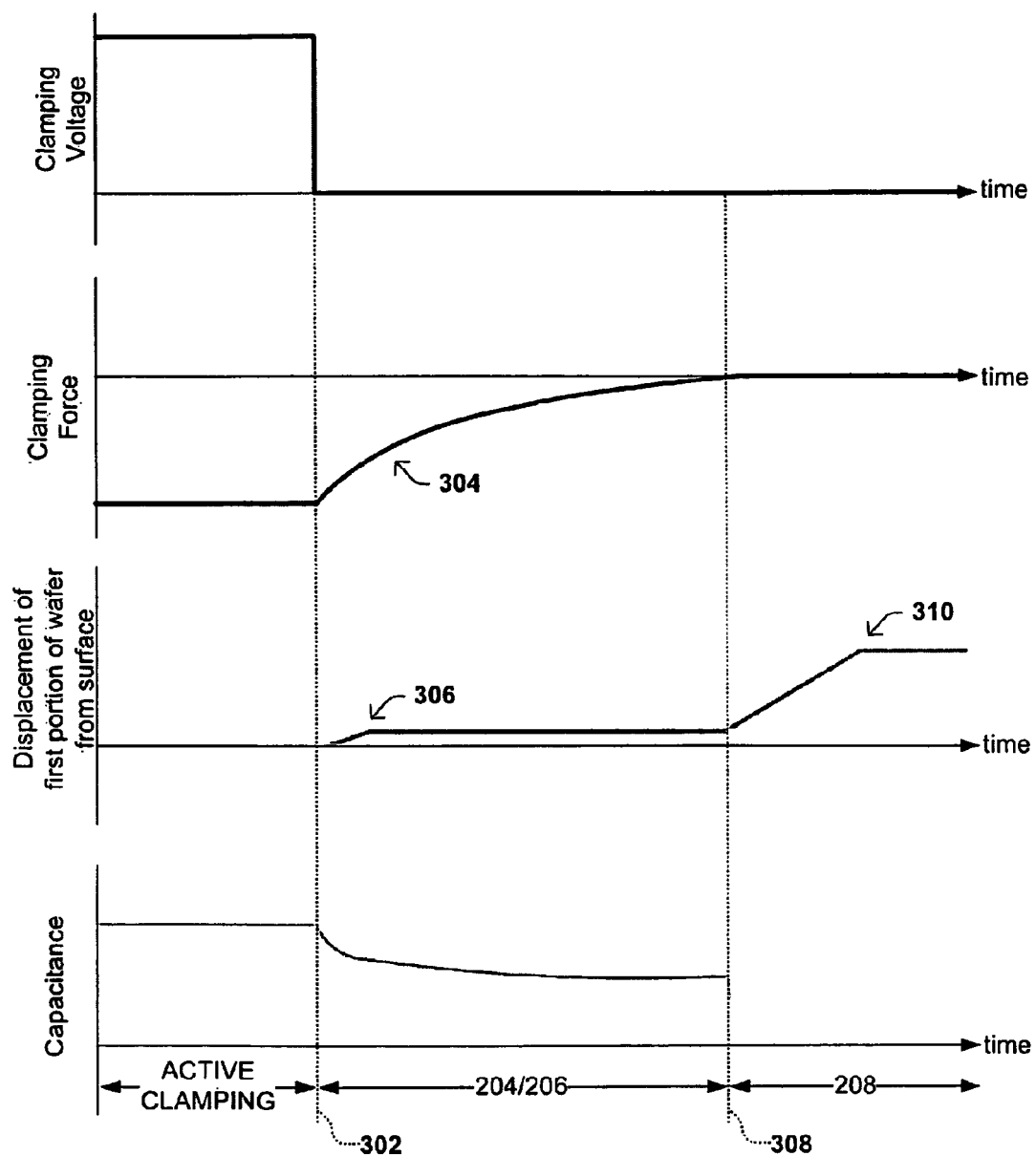
FIG. 3 is a series of graphs illustrating waveforms of clamping voltage, clamping force, distance of first region of wafer from surface, and capacitance as a function of time for an electrostatic chuck according to another aspect of the present invention.

As an example, FIG. 3 shows a series of waveform diagrams that are consistent with the FIG. 2's methodology. For purposes of understanding, this example is discussed in the context of a flat-plate electrostatic chuck having a 150 mm diameter and a 0.2 mm dielectric 106 (e.g., an alumina layer).

In the regions of the timing diagrams marked "ACTIVE CLAMPING" a clamping voltage V of approximately ±2000 volts is applied, thereby establishing a static clamping force of approximately 250 Torr to adhere the wafer to the dielectric surface. The clamping voltage can be a direct current (DC) voltage or an alternating current (AC) voltage. If AC voltage is used, it will often be a multi-phase voltage (e.g., three-phase or six-phase). Ion implantation, plasma-based or vacuum-based semiconductor processing, or other processing can be carried out on the wafer while the wafer is actively clamped in place.

At time 302, the clamping voltage is de-activated. In the illustrated embodiment the deactivation of the clamping voltage corresponds to approximately 0V, but it could also correspond to another voltage having a magnitude that is substantially less than that of the active clamping voltage. This deactivated voltage could be positive or negative, depending on the implementation. As a result of the deactivated clamping voltage, the clamping force tends to decrease in time, as shown by numeral 304. However, because the wafer and electrostatic clamp act as an RC circuit that have residual charge stored therein, the clamping force does not instantly go to zero but rather drops in a gradual (e.g., exponential) manner.

In regions 204/206, the wafer is lifted a first distance from the surface of the electrostatic chuck, as shown by numeral 306. In some embodiments, the first distance is between approximately 0.1 mm and approximately 5 mm or between 0.5 mm and 2 mm. In one particular embodiment, the first distance is approximately 0.75 mm. In any event, because electrostatic attraction (clamping force) may remain between the wafer and chuck at 204/206, only a first region of the wafer is peeled from the dielectric surface while a second region of the wafer remains adhered to the dielectric surface.

As the lift assembly lifts the wafer this first distance, the controller monitors a predetermined condition indicative of when it is proper to completely remove the wafer from the chuck. For example, in FIG. 3 the predetermined condition is met at time 308. Thus, at time 308 the controller instructs the lifting assembly to move the wafer to a second distance from the surface or otherwise completely remove the wafer from the electrostatic chuck. In FIG. 3's example, the wafer is lifted to the second distance and completely removed from the electrostatic chuck at time 310.

In a preferred embodiment, the controller monitors the predetermined condition by providing a low-frequency AC signal to measure the capacitance between the wafer and the chuck. The controller compares the measured capacitance to a threshold level. If the measured capacitance favorably compares to the threshold level, the controller assumes the clamping force is sufficiently low to safely remove the wafer from the chuck. In one embodiment, this signal is a 128 Hz AC signal to monitor the capacitance between the electrode and ground. With a wafer clamped the signal might be 12000 scaled counts and with no wafer clamped the signal might drop to 6000 scaled counts.

In another embodiment, the controller monitors the condition by waiting for an expiration time to pass. This expiration time is often measured from time 302, at which the clamping voltage was deactivated. For example, if the controller determines that more than 1000 ms has passed after deactivating the clamping voltage, the controller can instruct the lifting assembly to remove the wafer from the chuck. While the use of an expiration time has some benefits, measuring the capacitance between the wafer and the chuck is preferred because it can automatically account for wafer to wafer and process to process differences.

Figure 4A:
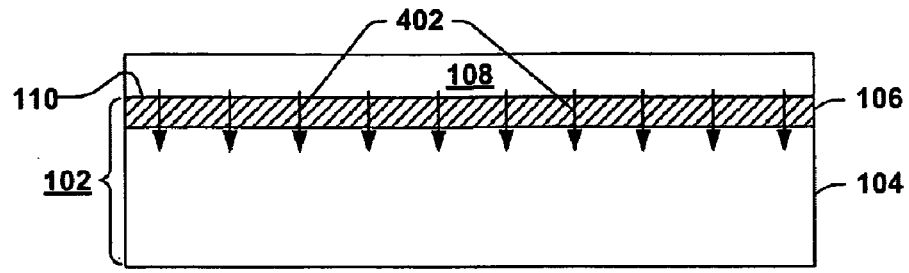
FIGS. 4A-4C are cross sectional views illustrating a wafer and electrostatic chuck at various stages of declamping in accordance with another aspect of the present invention.
Figure 4B:
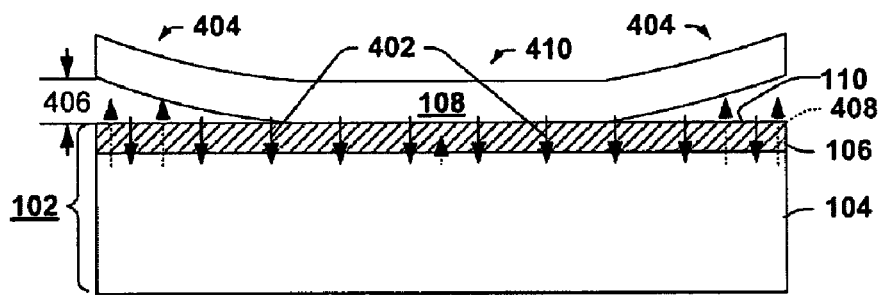
Figure 4C:
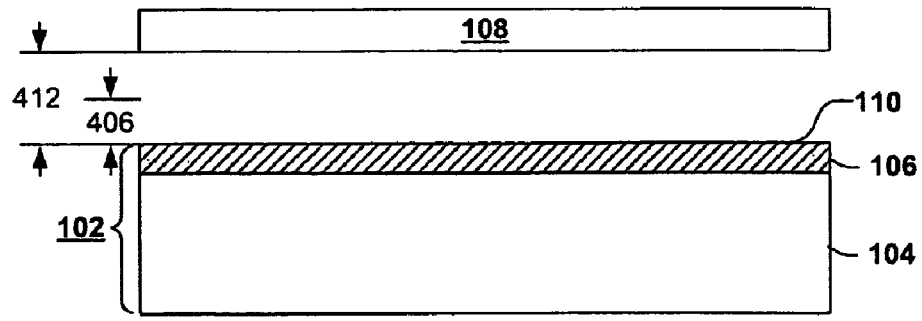

FIGS. 4A-4C show cross-sectional views as a wafer 108 is removed over time from an electrostatic chuck 102. FIG. 4A depicts a time when a backsurface of the wafer 108 is substantially adhered to the dielectric surface 110 of the electrostatic chuck 102. This cross-section is a typical example of when the clamping voltage is active or has just been deactivated. Thus, electrostatic force lines 402 indicate the wafer 108 is attracted to the electrostatic chuck 102 at this time.

FIG. 4B depicts a time when the lifting assembly has lifted the outer edge region 404 of the wafer 108 a first distance 406 from the dielectric surface 110 of the chuck. This cross-section could relate to a lifting apparatus with pins or fingers that contact and lift the outer edge region 404 of the wafer 108. As shown, at this time, the electrostatic force 402 in a central region 410 of the wafer is greater than the force 408 due to the lifting apparatus. Therefore, although the outer edge region 404 is lifted to a first distance 406, the central region 410 remains adhered to the dielectric surface 110. In various un-illustrated embodiments, the central region 410 (or other regions) could be lifted at this time to the first distance 406 instead of the outer edge region 404. The pre-determined condition is monitored during this time, as previously discussed.

Finally, in FIG. 4C, the pre-determined condition is met, and the wafer 108 is completely removed from the dielectric surface 110 of the electrostatic chuck. Thus, in one example, the wafer can be lifted to a second distance 412 that achieves complete removal of the wafer from the dielectric surface 110.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for de-clamping a wafer that is electrically adhered to a surface of an electrostatic chuck by a clamping voltage, comprising:
    deactivating the clamping voltage;
    following the deactivation, lifting and holding a first region of the wafer a first distance from the surface of the electrostatic chuck while a second region of the wafer remains adhered to the surface of the electrostatic chuck;
    measuring an elapsed time for which the first region of the wafer is held at the first distance from the surface of the electrostatic chuck; and
    selectively lifting the second region from the surface of the electrostatic chuck based on whether the elapsed time is greater than or equal to a predetermined expiration time.

2. The method of claim 1, wherein the first distance is greater than approximately 0.1 mm and less than approximately 5 mm.

3. The method of claim 1, wherein the clamping voltage is a direct current (DC) voltage.

4. The method of claim 1, wherein the clamping voltage is an alternating current (AC) voltage.

5. The method of claim 4, wherein the AC voltage is a multi-phased AC voltage that establishes an approximately constant force to adhere the wafer to the surface of the electrostatic chuck.

6. The method of claim 1, wherein the first region corresponds to an outer edge region of the wafer.

7. The method of claim 6, wherein the second region corresponds to a central region of the wafer.

8. A system for processing a wafer, comprising:
    an electrostatic chuck comprising a one or more electrodes operable to provide an electrostatic clamping force between the wafer and a surface of the electrostatic chuck;
    a power supply configured to provide a clamping voltage to the one or more electrodes; and
    a lifting assembly adapted to during a first time lift a first region of the wafer a first distance from the surface of the electrostatic chuck while a second region of the wafer remains on the surface;
    a controller adapted to measure an elapsed time from when the first region of the wafer is lifted from the surface of the electrostatic chuck, and provide control signals to the lifting assembly to selectively lift the entire wafer from the surface based on whether the elapsed time is greater than or equal to a predetermined expiration time.

9. The system of claim 8, where the lifting assembly is a mechanical lifting assembly.

10. The system of claim 9, where the mechanical lifting assembly comprises at least one pin adapted to movably extend from the surface of the electrostatic chuck to lift the wafer therefrom.

11. The system of claim 9, member comprises an arm adapted to grasp the wafer and lift the wafer from the surface of the electrostatic chuck.

12. The system of claim 8, where the lifting assembly comprises at least one of: an electrostatic lift assembly adapted to provide an electrostatic force to lift the wafer, or a magnetic lift assembly adapted to provide a magnetic force to lift the wafer.

13. The system of claim 8, where the lifting assembly comprises a pressurized gas supply adapted to lift the wafer.

14. The system of claim 8, wherein the surface of the electrostatic chuck comprises a flat plate.

15. The system of claim 8, wherein the controller is adapted to monitor the predetermined condition by determining whether a capacitance as measured between the wafer and the electrostatic chuck favorably compares to a threshold value.

16. A method for de-clamping a wafer that is electrically adhered to a surface of an electrostatic chuck by a clamping voltage, comprising:
    deactivating the clamping voltage;
    for a time following the deactivation, lifting and holding a first region of the wafer a first distance from the surface of the electrostatic chuck while a second region of the wafer remains adhered to the surface of the electrostatic chuck;
    during the time when the first region of the wafer is held at the first distance from the surface of the electrostatic chuck, measuring multiple successive values of a dynamic condition that changes during the time; and
    after the time has elapsed, selectively lifting the second region from the surface of the electrostatic chuck based on whether one or more of the multiple successive values has a predetermined relationship with a threshold value.

17. The method of claim 16, wherein measuring the multiple successive values comprises:
    measuring multiple successive capacitance values between the wafer and the electrostatic chuck.

18. The method of claim 16, wherein measuring the multiple successive values comprises:
    providing an alternative current (AC) voltage to measure multiple successive capacitance values between the wafer and the electrostatic chuck.

* * * * *